United States Patent
Kim et al.

(10) Patent No.: US 8,035,122 B2
(45) Date of Patent: Oct. 11, 2011

(54) LIGHT DIFFUSION TYPE LIGHT EMITTING DIODE

(75) Inventors: Jae-Pil Kim, Gwangju (KR);
Seung-Hyun Park, Gwangju (KR);
Tae-Hun Kim, Gwangju (KR);
Jae-Moon Lee, Jeollanam-do (KR);
Young-Moon Yu, Daejeon (KR)

(73) Assignee: Korea Photonics Technology Institute, Gwangju (KR)

( * ) Notice: Subject to any disclaimer, the term of this patent is extended or adjusted under 35 U.S.C. 154(b) by 363 days.

(21) Appl. No.: 11/991,143

(22) PCT Filed: Oct. 20, 2006

(86) PCT No.: PCT/KR2006/004294
§ 371 (c)(1),
(2), (4) Date: May 21, 2008

(87) PCT Pub. No.: WO2007/046664
PCT Pub. Date: Apr. 26, 2007

(65) Prior Publication Data
US 2009/0116216 A1    May 7, 2009

(30) Foreign Application Priority Data

Oct. 21, 2005    (KR) .................. 10-2005-0099826

(51) Int. Cl.
*H01L 33/00*    (2010.01)
(52) U.S. Cl. .................. 257/98; 257/100; 257/E33.061; 257/E33.059; 257/E33.074
(58) Field of Classification Search .................... 257/98, 257/100, E33.061, E33.059, E33.074; 313/501, 313/502
See application file for complete search history.

(56) References Cited

U.S. PATENT DOCUMENTS

| 4,191,943 A | 3/1980 | Cairns et al. |
| 5,140,220 A | 8/1992 | Hasegawa |
| 6,069,440 A | 5/2000 | Shimizu et al. |
| 6,614,170 B2 | 9/2003 | Wang et al. |
| 6,653,765 B1 | 11/2003 | Levinson et al. |

FOREIGN PATENT DOCUMENTS

| JP | 2005167079 A | * | 6/2005 |
| JP | 2005197317 A | * | 7/2005 |

* cited by examiner

*Primary Examiner* — Minh-Loan T Tran
(74) *Attorney, Agent, or Firm* — The Nath Law Group; Jerald L. Meyer; Sungyeop Chung

(57) ABSTRACT

The present invention relates to light diffusion type light emitting diodes, more particularly, to a light emitting device having a large divergence angle by widely spreading an emitted light from a single color to a white color and a method thereof. The light emitting diode including the encapsulating layer according to the present invention is characterized by including at least two materials with different characteristics. According to the present invention, an encapsulating material for light emitting diode is mixed with at least two materials with a different polarity or a refractive index to easily form a light emitting diode. In addition, the light emitting diode die is bonded on the bottom surface of a cup, and an encapsulating material and microspheres are dispersed in the vicinity and upper portion of the light emitting diode and the entire light emitting diode, therefore the light emitting diode has a large and uniform divergence angle due to a light uniformly scattered and refracted. Furthermore, the microsphere particles with similar density to the encapsulating layer exist, thereby solving a problem of precipitation of particles, which occurs when the existing inorganic particles are dispersed.

15 Claims, 2 Drawing Sheets

[Fig. 1]
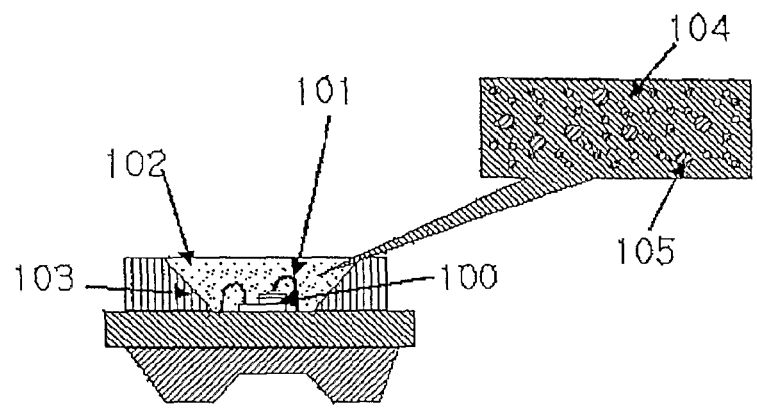
[Fig. 2]
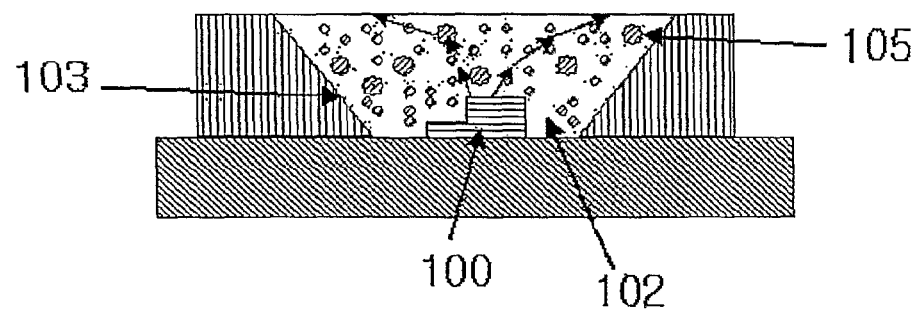
[Fig. 3]
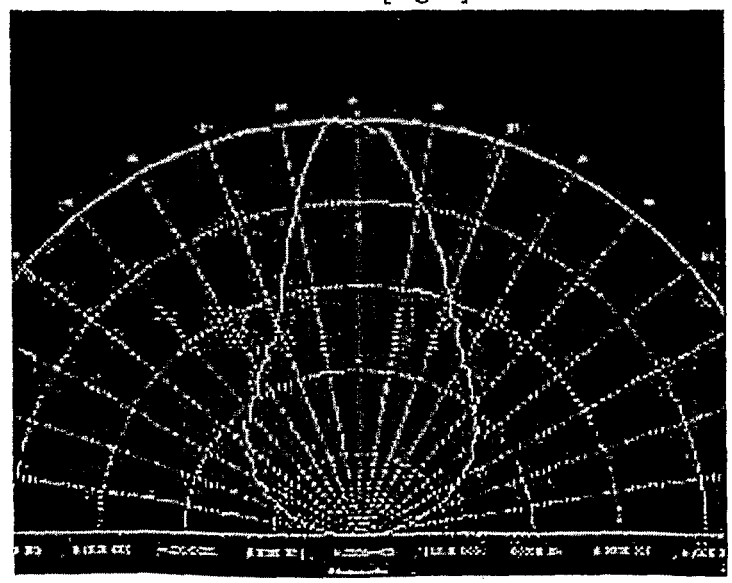

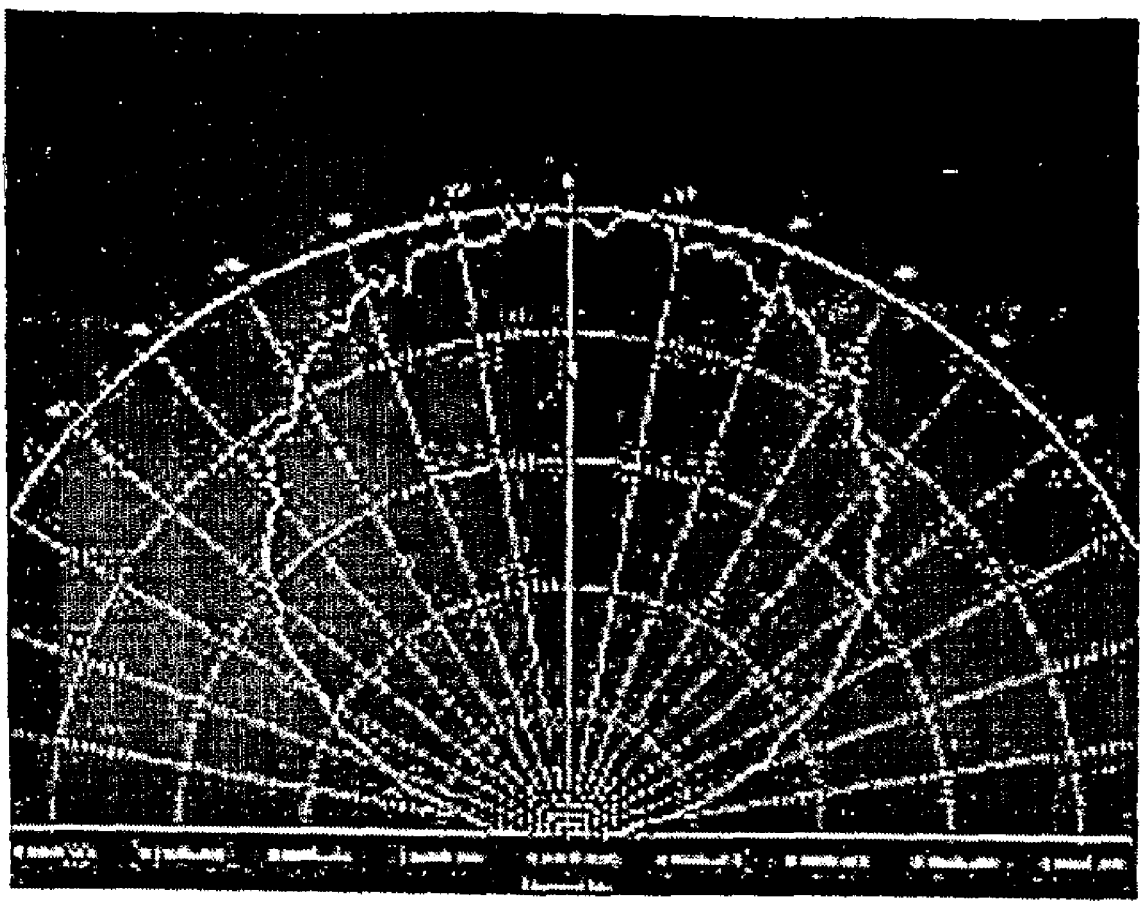
[Fig. 4]

LIGHT DIFFUSION TYPE LIGHT EMITTING DIODE

TECHNICAL FIELD

The present invention relates to light diffusion type light emitting diodes, more particularly, to a light emitting device having a large divergence angle by widely spreading an emitted light from a single color to a white color obtained by mixing various colors.

BACKGROUND ART

A light emitting diode (referred to as LED, hereinafter) has been recently changed from a light source for display into a light source for lighting LED to be expected as a next-generational energy saving light source and may replace an incandescent bulb or a fluorescent lamp. Therefore, technology innovations in the field of white LED technology, semiconductor lighting or a solid state lighting have been made in the worldwide.

In view of a light emitting mechanism of an LED, a light radiation basically depends on peculiar characteristics of a semiconductor and a fluorescent substance not on a heat or a discharged light. Because a LED lighting equipment does not feel hot unlike an incandescent bulb when it is touched, it is safe. Also, it generates less wastes because of its property that is longlasting. In addition, the LED lighting equipment does not include harmful materials such as fragile glass, mercury or organic material, therefore it is the earth environment-friendly light source for lighting. Therefore, the LED lighting equipment can be applied in various fields as well as in general lightings and is expected to form a huge market for the upcoming 10 years.

In general, a semiconductor light emitting diode is called a point source of light because of a small light emitting area of a LED and its property of going straight on. Accordingly, a lot of researches for obtaining a light emitting diode having a uniform and large divergence angle have been conducted. In general, a method of mixing inorganic and organic particles with an encapsulating material to be packaged or a method of widely spreading a light using a lens have been used. The former method is affirmatively used because it is benefical in saving the prime cost of a product and miniaturization.

As the prior art, a method to enlarge a divergence angle by dispersing light-conductive particles that scatter a light on the cover of a lamp is registered in U.S. Pat. No. 4,191,943 and a method to enlarge a divergence angle by dispersing inorganic particles such as CaF in the range of 6 to 25 wt % on an encapsulating layer is registered in U.S. Pat. No. 5,140,220.

By the way, an application about a method to use a light diffusing agent and a fluorescent substance altogether is pending. Nichia uses barium titanate, titanium oxide, aluminum oxide and silicone dioxide as diffusing agent for making a white color by mixing a blue wavelength lighting with a fluorescent substance in U.S. Pat. No. 6,069,440. As the similar technology, Arima Optoelectronics registered a technology using a fluorescent substance and bubbles in U.S. Pat. No. 6,614,170B2 and General Electric Company registered a technology of forming a diffusing layer separately from a fluorescent layer to diffuse a light emitted from a LED die in U.S. Pat. No. 6,653,765.

As described above, researches for widening a light diffusion range of a diode continue.

DISCLOSURE OF INVENTION

Technical Problem

The present invention has been made to solve the above problem. An object of this invention is to make a light emitted from the LED wide and uniform. Another object of the present invention is to provide a monocolored, multicolored and white colored light emitting diode having a large divergence angle by dispensing an encapsulating material, which includes microspheres formed automatically on the entire light emitting surface of the light emitting diode.

Technical Solution

In order to achieve the above objects, a light emitting diode including an encapsulating layer of the present invention comprises: a light emitting diode positioned on a substrate to emit a light; and an encapsulating layer enclosing the light emitting diode, including an encapsulating material and a microsphere dispersed to the encapsulating material. The encapsulating material may be at least two light diffusion type encapsulating materials with a different refractive index or polarity.

According to the present invention, the encapsulating layer is positioned on the substrate and surrounded by a supporting section formed in the vicinity of the light emitting diode.

According to the present invention, it is preferable that the supporting section be a reflector for reflecting a light emitted from the light emitting diode.

According to the present invention, it is preferable that the refraction index is in the range of 1.4 to 2.0, which is the range of a general encapsulating material.

According to the present invention, it is preferable that the microsphere is formed as one or more material of encapsulating materials is separated partly in micro-phase.

According to the present invention, the encapsulating material is at least one material selected from epoxy which is not hardened or silicone and exists in the form of liquid. It is preferable that the size of the microsphere particle be 0.05☐ or greater.

According to the present invention, it is preferable that the encapsulating material is formed by a dispensing method.

According to the present invention, it is preferable that the encapsulating layer further comprise a fluorescent substance for changing the emitted light into a light having a long wavelength.

According to the present invention, it is preferable that the fluorescent substance use YAG (yttrium-aluminum-garnet).

In order to achieve the above objects, a method of manufacturing a light emitting diode including an encapsulating layer of the present invention comprises: forming a light emitting diode and a supporting section in the vicinity of the light emitting diode on a substrate; and forming an encapsulating layer by mixing at least two liquid encapsulating materials with a different index or a polarity in a space which is formed by the upper portion of the light emitting diode and the supporting section, and hardening the same.

The encapsulating layer may include a microsphere which is formed as one or more material of the at least two mixed liquid encapsulating materials is separated partly in micro-phase.

Advantageous Effects

As described above, according to the present invention, an encapsulating material for light emitting diode is mixed with at least two materials with a different polarity or a refractive index to easily form the light emitting diode of this invention. In addition, the light emitting diode die is bonded on the bottom surface of a cup, and an encapsulating material and microspheres are dispersed in the vicinity and upper portion of the light emitting diode and the entire light emitting diode therefore, the light emitting diode of the present invention has a large and uniform divergence angle due to a light uniformly scattered and refracted. Furthermore, the microsphere particles with similar density to the encapsulating layer exist, thereby solving a problem of precipitation of particles, which occurs when the existing inorganic particles are dispersed.

BRIEF DESCRIPTION OF THE DRAWINGS

FIG. 1 is a side cross-sectional view showing a device for emitting light having a light diffusion layer in accordance with an embodiment of the present invention.

FIG. 2 is a schematic view showing a mechanism that a divergence angle increases while a light emitted from a chip passes through a diffusion layer in accordance with an embodiment of the present invention.

FIGS. 3 and 4 show experimental results that a divergence angle increases while a light emitted from a chip passes through a diffusion layer in accordance with an embodiment of the present invention.

BEST MODE FOR CARRYING OUT THE INVENTION

Hereinafter, embodiments of the present invention will be described in detail with reference to the attached drawings. Reference now should be made to the drawings, in which the same reference numerals are used throughout the different drawings to designate the same or similar components in the following description of the present invention. Detailed descriptions may be omitted if it is determined that the detailed descriptions of related disclosing functions and constructions may make the gist of the invention unclear.

FIG. 1 is a cross-sectional view of a light diffusion diode including an encapsulating layer in accordance with an embodiment of the present invention.

In the above embodiment, a light diffusion diode includes a light emitting diode (100), a wire (101), an encapsulating layer (102) and a reflector (103).

The embodiment schematically shows a method for forming an encapsulating layer (102) on the light diffusion diode (102).

The structure of a light diffusion diode now will be described briefly with reference to FIG. 1. A light emitting diode (100) is positioned on a substrate (the numeral is not indicated). It is preferable that the light emitting diode (100) be a light emitting diode (100) which mainly diffuses a monocolored light, a multicolored light and a white colored light. It is preferable that the light emitting diode (100) be configured to have a general lamp type or a surface mount device SMD type. In the structure of the light emitting diode (100), a light emitting diode die generating a monocolored light or a ultraviolet ray is bonded on the bottom of the reflector (103).

The light emitting diode (100) is provided with a wire (101) so that a power is supplied and a reflector (103) for reflecting a light emitted from the light emitting diode (100) is provided in the vicinity of the light emitting diode (100) in order to improve the efficiency of the light.

An encapsulating layer (102) according to the present invention is formed on the upper portion of the light emitting diode (100) and the grooves produced by the reflector (103).

The encapsulating layer (102) is filled with a material mixing a transparent encapsulating material and a fluorescent substance. It is preferable that the encapsulating material (102) being dispensed on the light emitting diode (100) be manufactured by mixing at least two materials with a different refractive index or a polarity before being dispensed. However, the encapsulating layer (102) may be dispensed by a general method for manufacturing a light emitting diode. At this time, the encapsulating material (102) being dispensed on the light emitting diode (100) may or may not include a fluorescent substance.

Preferably, the encapsulating material used in the light emitting diode (100) is silicone or epoxy and a divergence wavelength has a monocolored, multicolored and a white colored lights. In case that a fluorescent substance is used in the light emitting diode (100), it is preferable that it be a material for changing a light produced from the light emitting diode (100) into a light having a long wavelength.

In the encapsulating layer (102) of the light emitting diode, at least two polymers with a different polarity or a refractive index are separated partly in micro-phase so that at least one of the polymers exist in form of microsphere. The microsphere consisting of the encapsulating layer (102) may be epoxy or silicone which is used as an encapsulating layer for LED the most. If a fluorescent substance is used, it is a fluorescent substance which changes a wavelength produced form LED die into a long wavelength. For example, it may be a fluorescent substance such as yttrium-aluminum-garnet YAG. The light diffusion encapsulating material is at a liquid state, and is manufactured by mixing an epoxy resin and silicone resin which are not hardened and forming microspheres partly. After then, the encapsulating material and microspheres dispense in the package structure using a dispensing method to be an encapsulating layer.

In other words, silicone and epoxy as the encapsulating material which have been mainly used in the light emitting diode are mixed by a mixer to manufacture an encapsulating material. The encapsulating material, along with microspheres when a microsphere is formed, is dispensed by the existing process, preferably by a dispenser.

In addition, the present invention can be easily applied to a general light emitting diode having a type which two wires or a wire contact on the upper surface or a LED having a lamp-shaped structure. In case that a fluorescent substance is used, a method for manufacturing a light emitting device for converting a wavelength can be provided. The method includes a technology for manufacturing an encapsulating material where a microsphere is formed prior to manufacturing an encapsulating layer for LED. And the method may comprise a step for dispensing an encapsulating material and a microsphere which are mixed or not mixed with a fluorescent substance in the vicinity and on the upper portion of the light emitting diode and a step for cross-linking the encapsulating layer formed by an encapsulating material and a microsphere.

Accordingly, the light emitting device according to the present invention has microsphere particles which are uniformly dispersed to the entire encapsulating layer (102) of the light emitting diode. It is preferable that the size of a microsphere particle be greater than 0.05 μm which is the minimum scattering particle size in consideration that the range of a light emitting wavelength is in 200 to 800 nm. The encapsulating layer is to radiate a monocolored, a multicolored or a white colored light to a uniform and wide area.

The encapsulating layer (102) is constituted to entirely cover the upper surface and the side surface of the light emitting diode die being a substantial light emitting surface and for a light generated from the die to be spreaded to a very wide area, so that a narrow view angle which is a disadvantage of an LED can be improved. It is possible to solve the problems of precipitation and dispersion property of the particles produced and the adhesiveness with the encapsulating material, etc., which were caused from the process that the conventional inorganic particle powder and an encapsulating layer are mixed and sprayed and then hardened.

As shown in FIG. 1, the encapsulating layer should be formed in the vicinity and on the upper portion of a light emitting diode in order to sufficiently cover a light emitting surface of a light emitting diode die. The microsphere particle consisted of the encapsulating layer can be easily manufactured by mixing a small quantity of at least one encapsulating material of the at least two encapsulating materials. In addition, in an encapsulating layer after microspheres were formed, microsphere particles are not mixed one another and two or more encapsulating materials are not macroscopically phase-separated respectively while a degassing or a cross-linking process is performed.

A divergence angle of the light diffusion type light emitting device is mainly used for achieving the purpose of the present invention. The light emitting device according to the present invention may have a single color, multicolors or a white color. The light emitting device according to the present invention has microsphere particles being consisted of the encapsulating layer of a light emitting diode and the existing process for manufacturing LED may be used by itself.

FIG. 2 schematically show that a light diffusion type light emitting diode reflects a light in accordance with an embodiment of the present invention.

Referring to FIG. 2, the light emitting diode emits a monocolored, multicolored and a white colored light, but large portions of a monocolored, multicolored and a white colored light are scattered or refracted by microspheres of an encapsulating layer so that the light emitting diode has a desired uniformity and a divergence angle.

FIGS. 3 and 4 show a divergence angle of a light diffusion type light emitting diode having an encapsulating layer in accordance with an embodiment of the present invention.

FIG. 3 shows a divergence angle of a light emitting diode having a general encapsulating layer with 100% silicone, the divergence angle indicating 50°. FIG. 4 shows a divergence angle of a light diffusion type light emitting diode having an encapsulating layer where silicone forming a microsphere in accordance with an embodiment of the present invention and epoxy are mixed in the ratio of 77:23, the divergence angle being 114°. The microsphere particles in the molding section are uniformly scattered and if a fluorescent substance is used, a light emitted from the LED bumps into the fluorescent particles so that the wavelength of the light is changed and the emitted light is changed into a uniformly and widely emitted light due to a diffusing agent. Accordingly, it is known that the divergence angle is improved by twice or more due to a diffusion layer of the present invention.

As described above, although the preferred embodiments of the present invention have been disclosed for illustrative purposes, those skilled in the art will appreciate that various modifications, additions and substitutions are possible without departing from the scope and spirit of the invention as disclosed in the accompanying claims.

INDUSTRIAL APPLICABILITY

As an encapsulating material for a light emitting diode, at least two materials with a different polarity or a refractive index are mixed to manufacture microsheres which easily diffuse a light, and then the encapsulating material and microsphere particles are dispersed in the vicinity or on the upper portion of the light emitting diode and are packaged to be used for uniformly scattering and refracting the light of a light emitting diode, resulting in a large and uniform divergence angle of LED. In addition, because microsphere particles with the similar density exist in the encapsulating layer and precipitation of particles are decreased in comparison with the case that inorganic particles are dispersed when packaging the existing light emitting diode, the problem of decreasing the efficiency of a light caused by precipitation of particles can be solved, therefore the light emitting diode of the present invention can be industrially applied.

The invention claimed is:

1. A light diffusion type light emitting diode comprising:
    a light emitting diode positioned on a substrate to emit a light; and
    an encapsulating layer enclosing the light emitting diode, including an encapsulating material and microspheres dispersed to the encapsulating material,
    wherein the microspheres are uniformly dispersed in the encapsulating layer so that one or more materials contained in the encapsulating material are separated partly in micro-phase, and
    wherein the encapsulating layer further comprises a fluorescent substance for changing the emitted light into light having a long wavelength.

2. The light emitting diode of claim 1, wherein the encapsulating layer is positioned on the substrate and surrounded by a supporting section formed in the vicinity of the light emitting diode.

3. The light emitting diode of claim 2, wherein the supporting section is a reflector for reflecting a light emitted from the light emitting diode.

4. The light emitting diode of claim 1, wherein the encapsulating material includes at least two light diffusion type encapsulating materials with a different refractive index or a polarity.

5. The light emitting diode of claim 4, wherein the refractive index of the encapsulating material is in the range of 1.4 to 2.0.

6. The light emitting diode of claim 1, wherein the encapsulating material is at least one material selected from liquid epoxy which is not hardened and silicone.

7. The light emitting diode of claim 1, wherein the size of the microsphere particle is 0.05 μm or greater.

8. The light emitting diode of claim 1, wherein the encapsulating material is formed by a dispensing method.

9. The light emitting diode of claim 1, wherein the fluorescent substance comprises at least one selected from the group consisting of red fluorescent substance, green fluorescent substance, blue fluorescent substance and yellow fluorescent substance.

10. A method of manufacturing a light diffusion type light emitting diode comprising:
    forming a light emitting diode and a supporting section in the vicinity of the light emitting diode on a substrate; and
    forming an encapsulating layer by mixing at least two liquid encapsulating materials with a different refractive index or a polarity in a space, which is formed by the upper portion of the light emitting diode and the supporting section, and hardening the same,
    wherein the encapsulating layer includes microspheres that are uniformly dispersed in the encapsulating layer so that one or more materials contained in the at least two mixed liquid encapsulating materials are separated partly in micro-phase, and wherein the encapsulating layer further comprises a fluorescent substance for changing the emitted light into light having a long wavelength.

11. The method of claim 10, wherein the supporting section is a reflector for reflecting a light emitted from the light emitting diode.

12. The method of claim 10, wherein the refractive index of the encapsulating material is in the range of 1.4 to 2.0.

13. The method of claim 10, wherein the at least two liquid encapsulating materials are at least one material selected from liquid epoxy which is not hardened and silicone.

14. The method of claim 10, wherein the size of the microsphere particle is 0.05 µm or greater.

15. The method of claim 10, wherein the fluorescent substance comprises at least one substance selected from the group consisting of red fluorescent substance, green fluorescent substance, blue fluorescent substance and yellow fluorescent substance.

* * * * *